United States Patent [19]
Sakai et al.

[11] Patent Number: 6,109,509
[45] Date of Patent: *Aug. 29, 2000

[54] METHOD OF SECURELY MOUNTING CONDUCTIVE BALLS

[75] Inventors: Tadahiko Sakai; Shoji Sakemi, both of Fukuoka, Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/887,337

[22] Filed: Jul. 2, 1997

[30] Foreign Application Priority Data

Aug. 19, 1996 [JP] Japan ................................. 8-217021

[51] Int. Cl.⁷ ............................ B23K 1/018; B23K 1/00; B23K 31/02
[52] U.S. Cl. ........................ 228/246; 228/41; 228/180.22
[58] Field of Search .................................. 228/286, 245, 228/180.02, 173.2, 248.1, 41

[56] References Cited

U.S. PATENT DOCUMENTS

| | | | |
|---|---|---|---|
| 4,044,937 | 8/1977 | Hill et al. | 225/97 |
| 4,346,516 | 8/1982 | Yokouchi et al. | 29/845 |
| 4,650,233 | 3/1987 | Mang et al. | 294/64.1 |
| 4,684,113 | 8/1987 | Douglas et al. | 269/21 |
| 5,114,878 | 5/1992 | Maruyama et al. | 437/182 |
| 5,435,482 | 7/1995 | Variot et al. | 228/254 |
| 5,445,313 | 8/1995 | Boyd et al. | 228/248.1 |
| 5,506,385 | 4/1996 | Murakami et al. | 219/121.63 |
| 5,540,377 | 7/1996 | Ito | 228/41 |
| 5,768,775 | 6/1998 | Nakazato | 29/843 |
| 5,788,143 | 8/1998 | Boyd et al. | 228/253 |
| 5,836,520 | 11/1998 | Bhhandarkar et al. | 239/553.5 |
| 5,855,323 | 1/1999 | Yost et al. | 239/135 |

*Primary Examiner*—Patrick Ryan
*Assistant Examiner*—Kiley Stoner
*Attorney, Agent, or Firm*—Stevens, Davis, Miller & Mosher, L.L.P.

[57] ABSTRACT

A suction head sucks up conductive balls to its suction holes, and mounts them on pads of said workpiece. That is, the suction head is lowered so as to land the conductive balls onto the pads, and then is raised, and a positive pressure is applied in a space defined in the suction head and communicated with the suction holes and thereafter, the positive pressure is released so as to effect the atmospheric pressure in the space. As a result, the conductive balls are smoothly and surely separated from the suction holes and mounted onto the pads of the workpiece. Thereby it is possible to rapidly mount the conductive balls sucked at the lower surface of the suction head onto the pads of the workpiece.

5 Claims, 9 Drawing Sheets

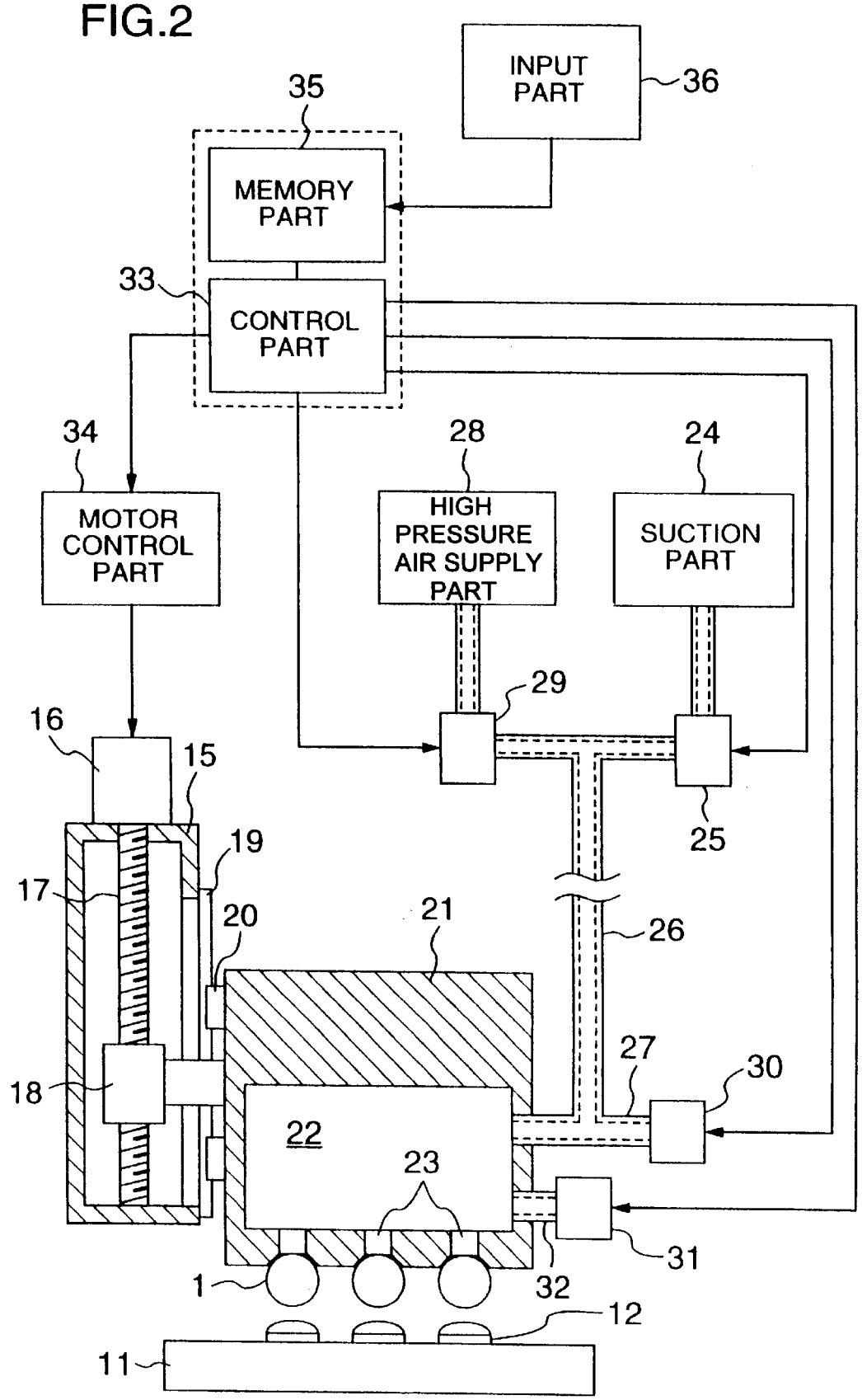

TRANSITION FROM NEGATIVE PRESSURE TO POSITIVE PRESSURE TO ATMOSPHERIC PRESSURE

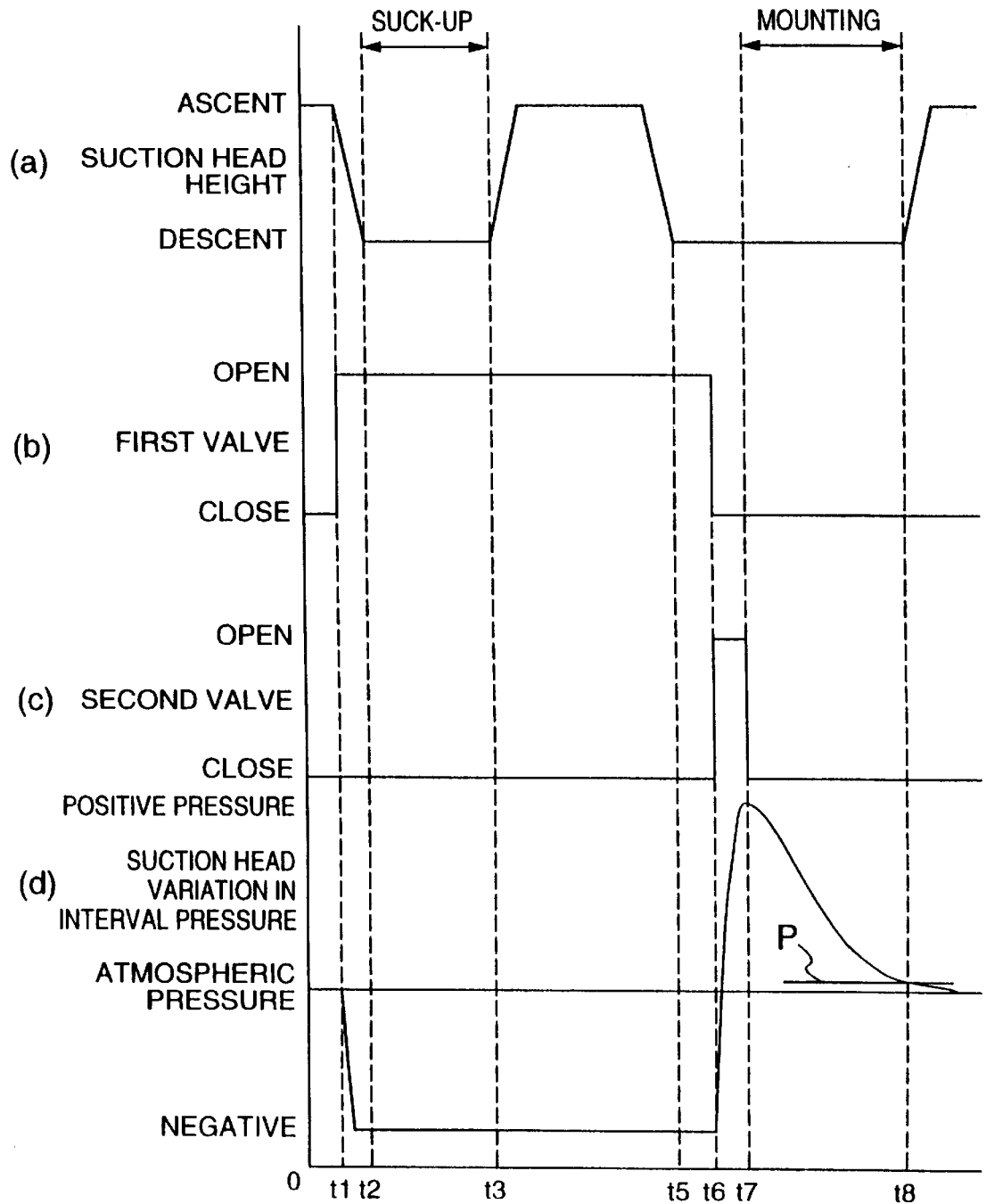

METHOD OF SECURELY MOUNTING CONDUCTIVE BALLS

BACKGROUND OF THE INVENTION

1. Field of the Invention

The present invention relates to a method of mounting conductive balls on pads formed on a workpiece, and also relates to a device used in this method.

2. Related Art of the Invention

As a method of manufacturing a workpiece provided with bumps such as flip chips, there has been known a method in which solder balls or conductive balls are used. In this method, the conductive balls stored in a supply part are picked up at the lower surface of a suction head through vacuum suction, and are then mounted on pads on a workpiece. This method is advantageous since a large number of conductive balls can be mounted onto a workpiece in a batch.

Referring to FIGS. 9a to 9c which are views for explaining a conventional method of mounting conductive balls, a suction head is lowered and raised above a workpiece so as to mount conductive balls onto pads 5 on the workpiece 4. Referring to FIG. 9a, the conductive balls 1 are sucked up under vacuum to several suction holes 3 formed in the lower surface of the suction head 2. The inside of the suction head 2 is evacuated by a suction part (which is not shown) and accordingly, vacuum is effected in the inside of the suction head 2. The pads 5 on the workpiece 4 is coated thereover with flux 6. The workpiece 4 is, for example, a semiconductor chip or a substrate which is cut our from a wafer.

Next, as shown in FIG. 9b, the suction head 2 is lowered so as to land the conductive balls onto the pads 5 while the suction in the suction head 2 is stopped in order to release the vacuum suction to the conductive balls 1. As a result, the atmospheric air enters the inside of the suction head 2 through gaps defined between the conductive balls 1 and the suction holes (refer to the arrows indicated by broken lines in FIG. 9b), and accordingly, the atmospheric air is effected in the inside of the suction head 2. Thereafter, the suction head 2 is raised while the conductive balls 1 are left on the pads 5. Then, the workpiece 4 is sent to a heating furnace in which the conductive balls are heated so as to be melted, and then are cooled for solidification thereof. Thus, bumps are formed on the pads 5.

In the method as mentioned above, the suction head 2 is lowered so as to land the conductive balls 1 on the pads 5 while the vacuum suction in the inside of the suction head 2 is stopped, as shown in FIG. 9b. Accordingly, since the suction head 2 is raised after the atmospheric air having entered in the inside of the suction head 2 sufficiently breaks the vacuum condition in the inside of the suction head 2, the time tact for setting the conductive balls 1 on the pads 5 becomes excessively long, and accordingly, the productivity associated therewith is low.

In order to solve the above-mentioned problem, there has been known such a measure that the suction head 2 is vibrated by a vibrator (which is not shown) in conditions shown in FIGS. 9b and 9c in order to promote the separation of the conductive balls 1 from the suction holes 3. Even with this measure, a relatively long time tact is required, and further, there has be such a problem that the conductive balls 1 are not always surely separated from the suction holes 3.

SUMMARY OF THE INVENTION

The present invention is devised in order to solve the above-mentioned problem, and accordingly, one object of the present invention is to provide a method of mounting conductive balls sucked up at the lower surface of a suction head, onto pads of a workpiece at a high speed.

To the end according to the present invention, there is provided a method of mounting conductive balls on pads of a workpiece, comprising the steps of sucking up the conductive balls reserved in a supply part to suction holes formed in a lower surface of a suction head by vacuum-suction effected in the inside of the suction head in order to pick up the conductive balls, lowering and raising the suction head to and from the workpiece having been positioned in a positioning part so as to mount the conductive balls onto pads on the workpiece while effecting a positive pressure in the inside of the suction head.

With this arrangement, the vacuum condition effected in the inside of the suction head is positively broken so as to immediately separate the conductive balls sucked by the suction holes under vacuum, therefrom, thereby it is possible to surely mount the conductive balls on the pads.

The present invention is detailed in the form of preferred embodiments of the present invention with reference to the drawings in which:

BRIEF DESCRIPTION OF THE DRAWINGS

FIG. 2 is a block diagram showing a suction head in the device shown in FIG. 1;

FIG. 8 is a time chart for explaining operation of the suction head shown in FIG. 7.

DESCRIPTION OF THE PREFERRED EMBODIMENTS OF THE INVENTION (First embodiment)

Figure 1:
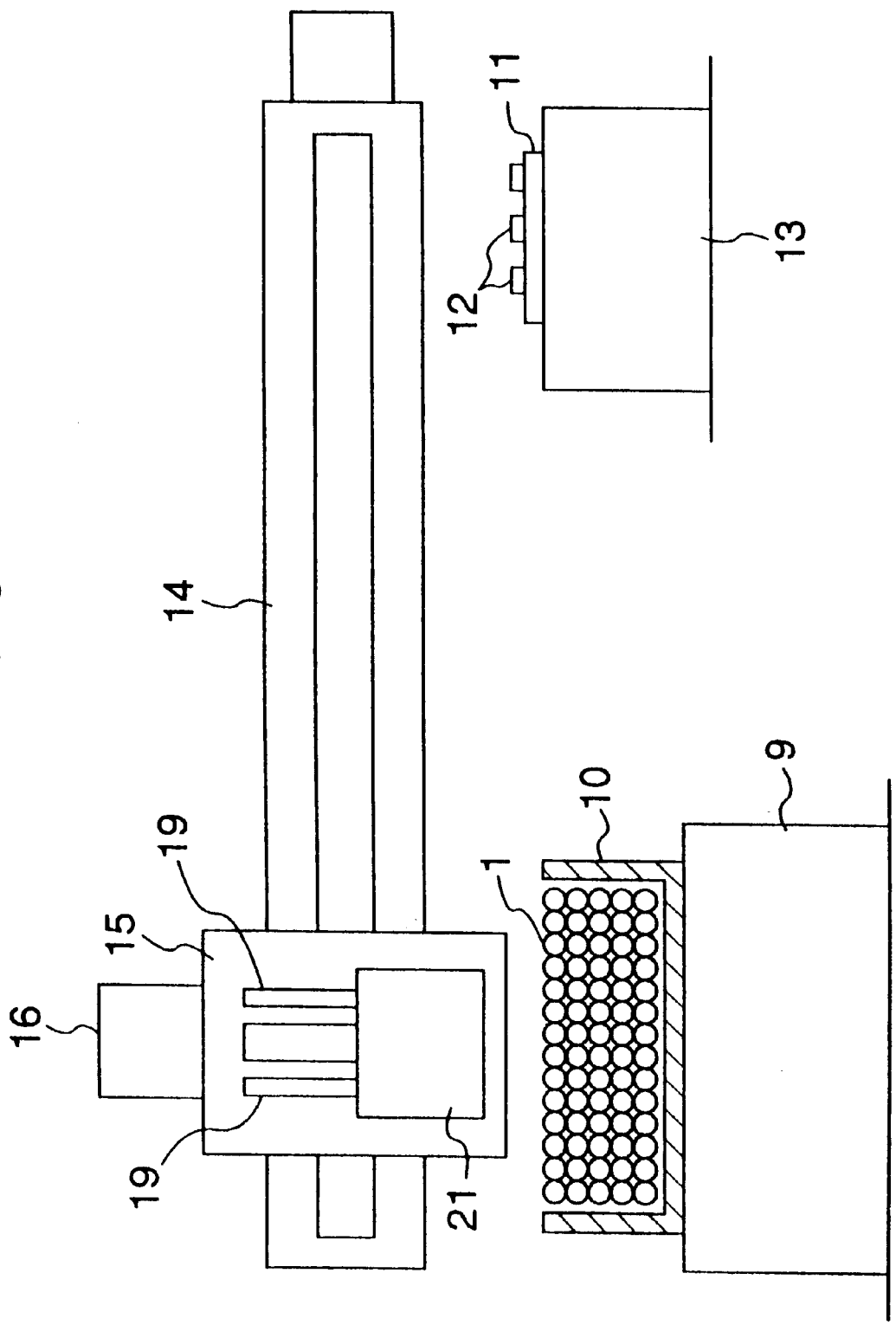
FIG. 1 is a front view illustrating a device for mounting conductive balls in a first embodiment of the present invention.
Figure 3A:
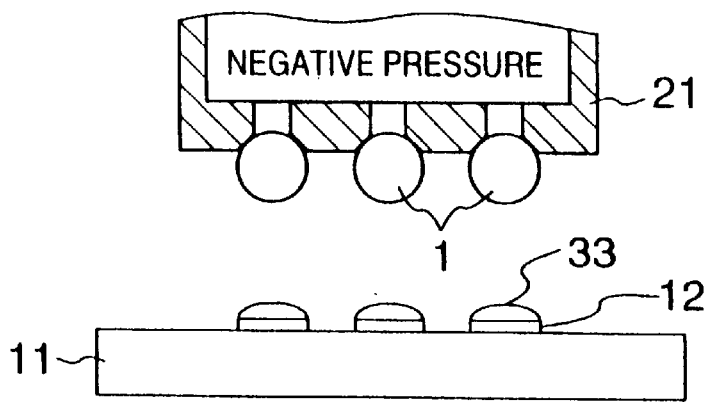
FIGS. 3a to 3c are views for explaining the mounting operation of the device shown in FIG. 1.
Figure 3B:
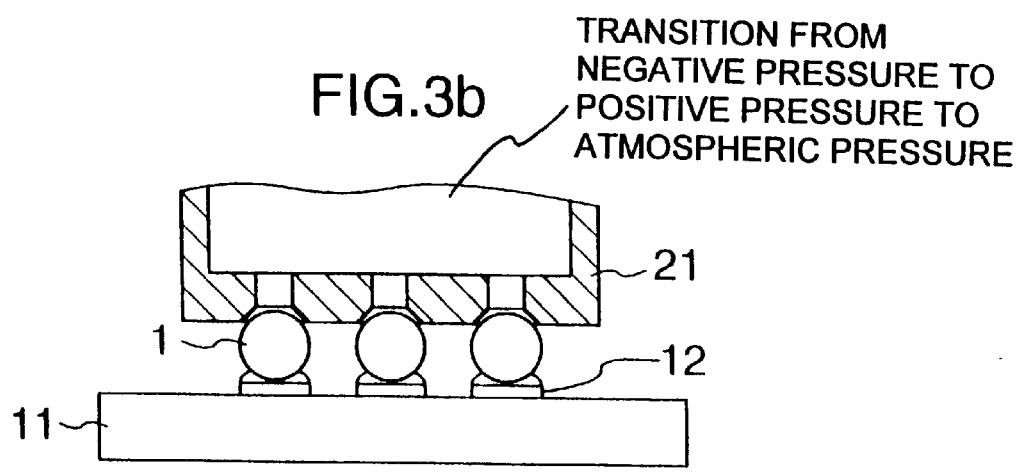
Figure 3C:
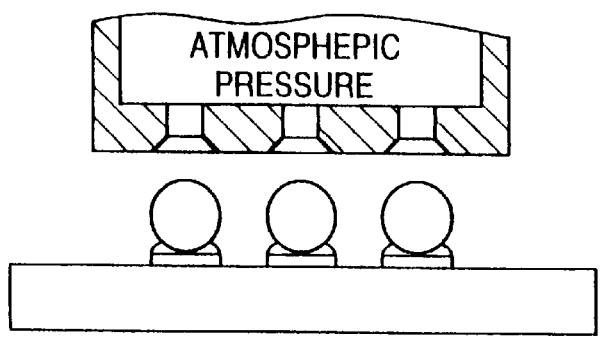
Figure 4:
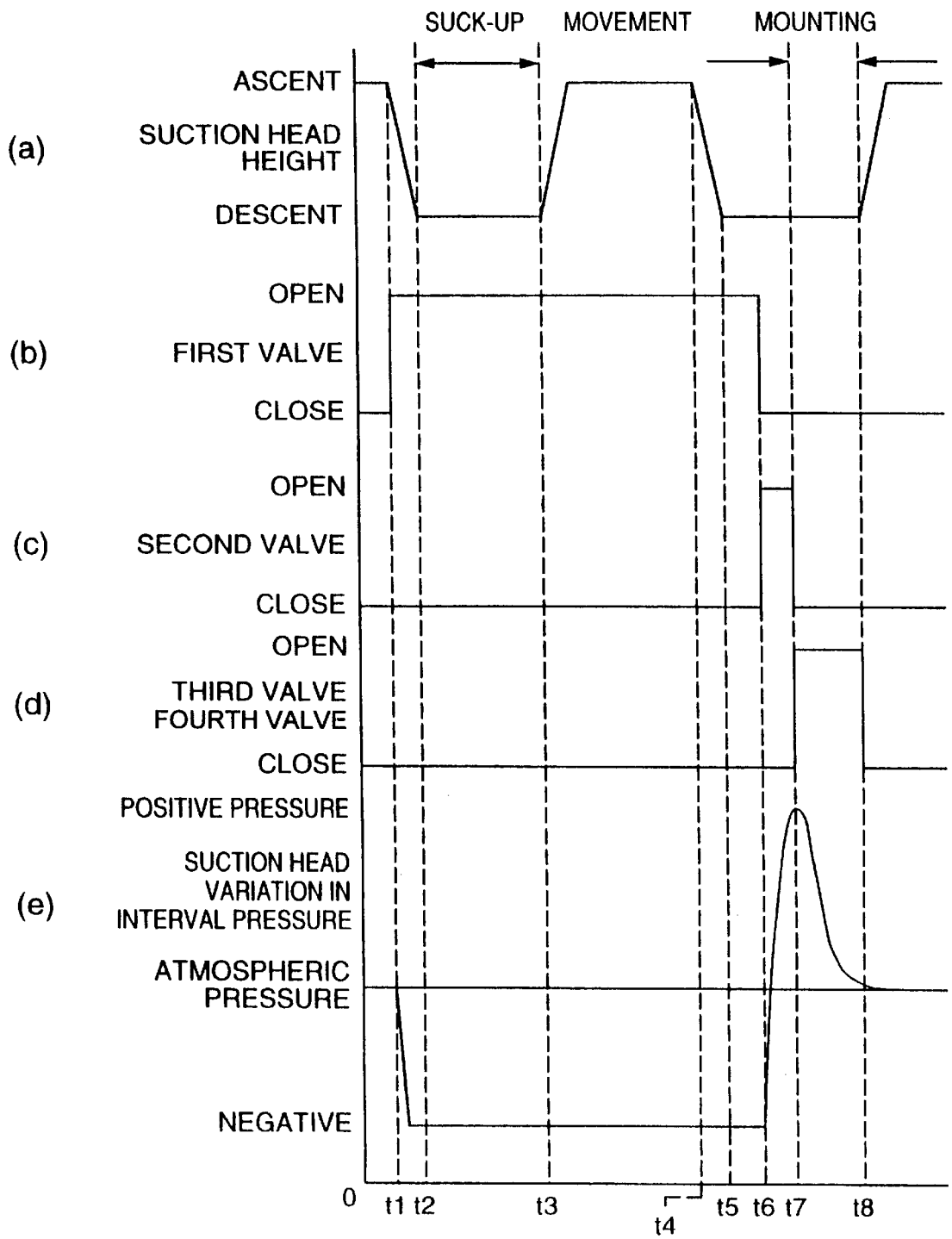
FIG. 4 is a time chart showing the operation of the suction head in the device shown in FIG. 1.

Explanation will be hereinbelow made of a first embodiment of the present invention with reference to FIG. 1 which is front view illustrating a device for mounting conductive balls, FIG. 2 which is a block diagram illustrating a suction head in the device shown in FIG. 1, FIGS. 3a to 3c which are views for explaining mounting operation of the device shown in FIG. 1, and FIG. 4 is a time chart for explaining the operation of the suction head in the device shown in FIG. 1.

At first, referring to FIG. 1, the overall structure of the device for mounting conductive balls will be hereinbelow explained.

Conductive balls 1 are held in a container 10 serving as a conductive ball supply part and supported on a base 9. A workpiece 11 provided on its upper surface with several pads 12 is positioned in a positioning part 13 which is composed of a rail 14 for adjusting the position of the workpiece by moving the latter in the X-axial and Y-axial directions.

A rail 14 is laid above the container 10 and carries thereon a casing 15 which is therefore slidable thereon. The casing 15 carries a suction head 21. During operation, the casing 15 and the suction head 21 are moved between the container 10 and the workpiece 11 along the rail 14.

Referring to FIG. 2, a motor 16 is provided on the casing 15, and a vertical feed screw 17 is provided in the casing 15. A nut 18 is fitted on the feed screw 17, and is coupled with the suction head 21. Accordingly, when the motor 16 is driven so as to rotate the feed screw 17, the nut 18 is moved up and down along the feed screw 17 so that the screw head 21 is also moved up and down. That is, the motor 16, the feed screw 17 and the nut 18 constitute a means for moving the suction head 21 up and down. A vertical guide rail 19 is provided to the front surface of the casing 15, and a slider 20 is provided at the rear surface of the suction head 21 and is fitted on the guide rail 19. Accordingly, the guide rail 19 and the slider 20 are adapted to vertically guide the suction head.

Referring to FIG. 2, the suction head 21 defines therein a space 22, and is formed in its lower surface with several suction holes 23. The space 22 is communicated with a suction part 24 through the intermediary of a first valve 25 and pipe lines 26, 27. Further, the space 22 is connected thereto with a high pressure air supply part 28 through the intermediary of a second valve 29 and the pipe lines 26, 27. Further, the space 22 is connected thereto with a third valve 30 through the intermediary of the pipe line 27. A fourth valve 31 is connected to the space 22 through the intermediary of a pipe line 32. A control part 33 controls the suction part 24, the high pressure air supply part 28, the first valve 25, the second valve 29, the third valve 30, the fourth valve 31, and a motor control part 34 which in turn controls the drive of the motor 16. Data required for operation of the device is stored in a memory part 35. The necessary data can be inputted through an input part 36 such as a keyboard or a mouse.

Next, explanation will be made of the device for mounting the conductive balls, constituted as mentioned above, as a whole. Referring to FIG. 1, the suction head 21 is moved to a position above the container 10, and is then lowered and raised so as to pick up the conductive balls 1 to the suction head 21 under vacuum suction. Then, the suction head 21 is moved to a position above the workpiece 11, and then, is lowered and raised so as to set the conductive balls on pads 12 of the workpiece 11.

Referring to FIGS. 3a to 3c and FIG. 4, the operation of the suction head 21 will be detailed. In FIG. 4, the line (a) shows variation in the height of the suction head 21, and the lines (b), (c) and (d) show opening and closing operations of the first valve 25, the second valve 29, the third valve 20 and the fourth valve 31. Further, the line (e) shows variation in the internal pressure of the space 22 in the suction head 21.

As to the line (a) in FIG. 4, when the suction head 21 carries out sucking operation for picking up the conductive balls 1 reserved in the container 10, the suction head 21 initiates its lowering motion at the timing t1 indicated by the line (b) in FIG. 4 while the first valve 25 is opened so that the vacuum suction of the space 22 by the suction part 24 is started. Accordingly, as indicated by the line (e) in FIG. 4, the internal pressure of the space 22 is lowered to a negative pressure from the atmospheric pressure. Then, the lowering motion of the suction head 21 is stopped at the timing t2, and at this time, the conductive balls 21 are sucked up to the suction holes 32 through vacuum suction. Next, the raising motion of the suction head 23 is started at the timing t3, and the movement of the suction head 21 toward the workpiece 11 is initiated. During the above-mentioned operation, the second valve 29, the third valve 30 and the fourth valve 31 are all closed.

Next, the suction head 21 is shifted from the moving operation into the mounting operation. That is, the lowering motion of the suction head 21 is initiated at the timing t4, and is ended at the timing t5. FIG. 3a shows the condition at the timing t4. In this condition, the suction head 21 comes to a position right above the workpiece 11. At this stage, the pad 12 has been already coated thereover with flux 33 by a flux application means which is not shown. Further, FIG. 3b shows a condition at the timing t5. In this condition, the conductive ball 1 is landed onto the pads 12.

Next, the first valve 25 is closed at the timing t6, and accordingly, the vacuum suction effected by the suction part 24 is stopped while the second valve 29 is opened so as to feed air from the high pressure air supply part 28 into the space 22. Thus, the vacuum in the space 22 is broken, and accordingly, the internal pressure of the space 22 abruptly rises up as shown by the line (e) in FIG. 4 so that the internal pressure instantly changes from a negative pressure into a positive pressure. Then, the third valve 30 and the fourth valve 31 are opened at the timing t7, and accordingly, the space 3 is communicated with the outside thereof so that the air is instantly introduced from the space 22 into the outside. Thus, the internal pressure in the space 22 is abruptly lowered from the positive pressure to the atmospheric pressure (timing t8). During the period from the timing t6 to the timing t8, the suction head 21 is held at the lowermost position so as to prevent the conductive balls 1 from being blown off by the air discharged from the space 22 whose internal pressure has been positive, and accordingly, the conductive balls 1 are held at their positions by the suction holes 23.

As mentioned above, the internal pressure of the space 22 abruptly changes from a negative pressure to a positive pressure, and then to the atmospheric pressure during the period from the timing t6 to the timing t8. Thus, the suction holes 23 positively releases its vacuum suction for the conductive balls 1. Then, the third valve 30 and the fourth valve 31 are closed at the timing t8 while the raising motion of the suction head 21 is initiated (refer to FIG. 3c), and accordingly, the series of mounting operations are completed. As mentioned above, in the method in this embodiment, a position pressure is applied into the space 22 from the high pressure supply part 28 so as to positively break the vacuum in the space, and accordingly, the separation of the conductive balls 1 from the suction holes 23 is satisfied so that the conductive balls 1 can be mounted onto the pads 12 of the workpiece 11 in a short time. It is noted that the timings t1 to t8 are stored in the memory part 35 as program data.

(Second Embodiment)

Explanation will be made of a second embodiment of the present invention with reference to FIG. 5 which is a block diagram illustrating a suction head 21 of a device for mounting conductive balls, and FIG. 6 which is a time chart for explaining the operation of the suction head shown in FIG. 5.

Figure 5:
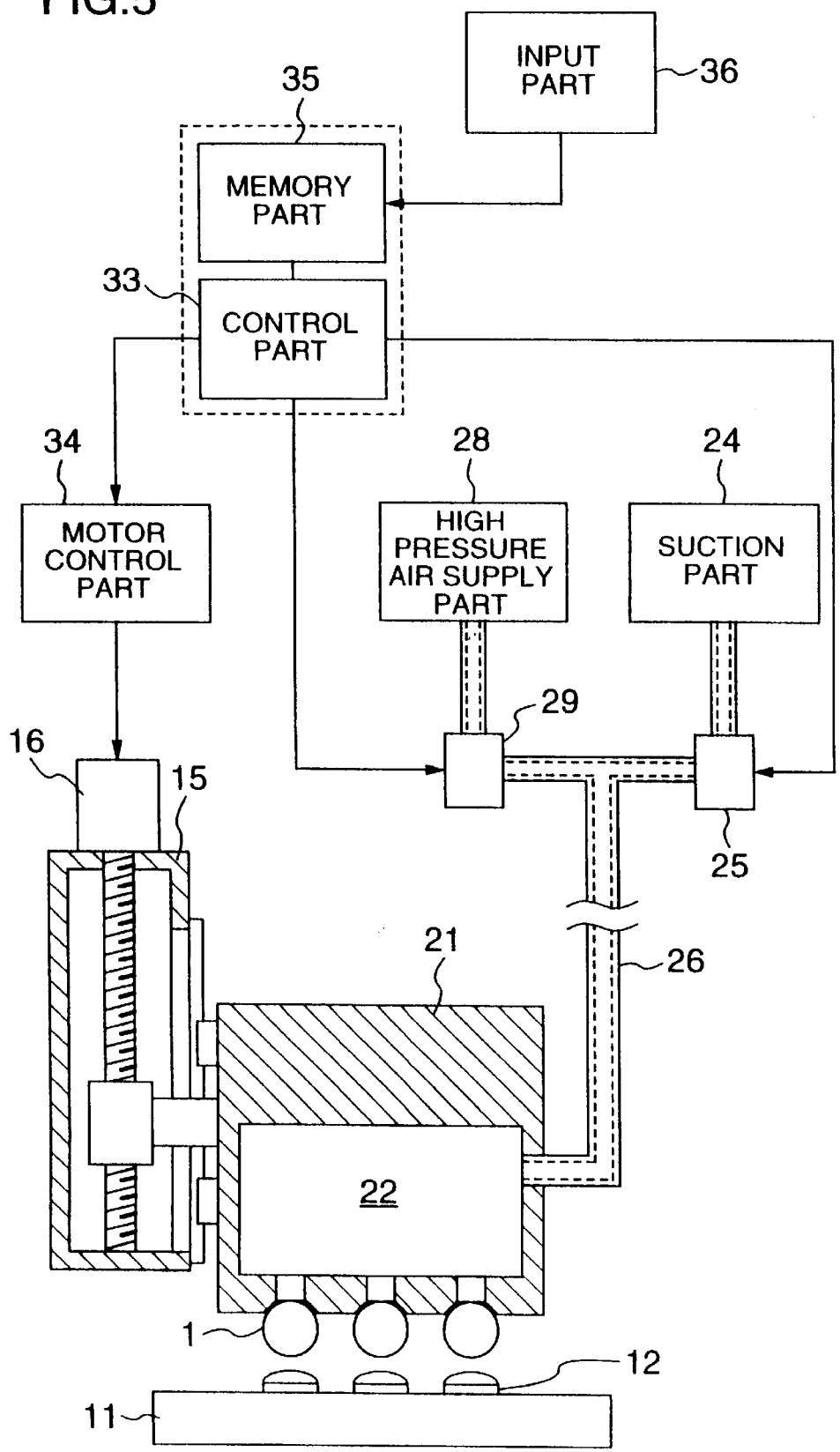
FIG. 5 is a block diagram showing a suction head in a device for mounting conductive balls in a second embodiment of the present invention.
Figure 6:
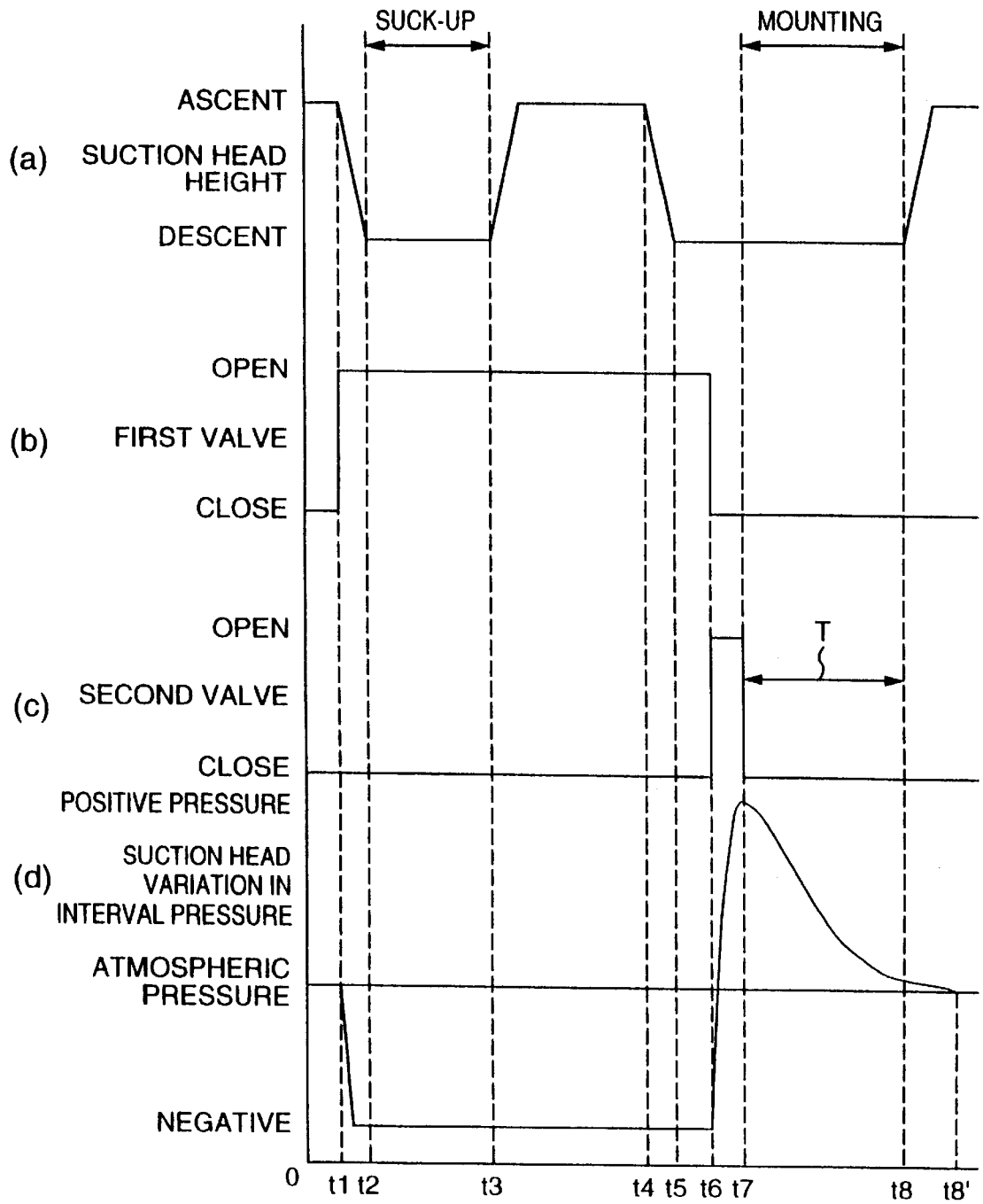
FIG. 6 is a time chart for explaining operation of the suction head shown in FIG. 5.

Referring to FIG. 5, the first valve 25 and the second valve 29 are connected to the space 22 in the suction head 21. It is noted the third valve 30 and the fourth valve 31 used in the first embodiment are eliminated in the second embodiment. Next, explanation will be made of the operation of the device in the second embodiment with reference to FIG. 6. The operation from the timing t1 to t7 is similar to that of the device in the first embodiment, and accordingly, explanation thereto will be omitted for the sake of brevity.

When the internal pressure of the space 22 becomes positive by feeding air from the high pressure supply part 28 into the space 22 at the timing t7, the second valve 29 is closed so as to stop the application of the positive pressure. Thus, the air in the space 22 leaks through slight gaps defined between the suction holes 23 and the conductive balls 1, and accordingly, the internal pressure of the space 22 is gradually lowered down to the atmospheric pressure. After a predetermined time T elapses, the suction head 21 is raised at the timing t8. This predetermined time T (which is required for lowering the internal pressure of the space 22 to a pressure substantially equal to the atmospheric pressure) has been previously determined by experiments, and stored in the memory part 35. Since slight gaps are inevitably defined between the suction holes 23 and the conductive balls 1 due to manufacturing unevenness and manufacturing errors, and accordingly, air inevitably leaks out from the space 22 through these slight gaps. Incidentally, should the timing t8 be set to the timing t8' at which the internal pressure of the space 22 is absolutely turned into the atmospheric pressure, the predetermined time T becomes longer. Accordingly, the timing t8 is set to the time at which the internal pressure of the space 22 is set to a value which is slightly higher than the atmospheric pressure, that is, which may be a slightly positive pressure. Thus, the predetermined time T can be shortened, thereby it is possible to shorten the time tact.

(Third Embodiment)

Figure 7:
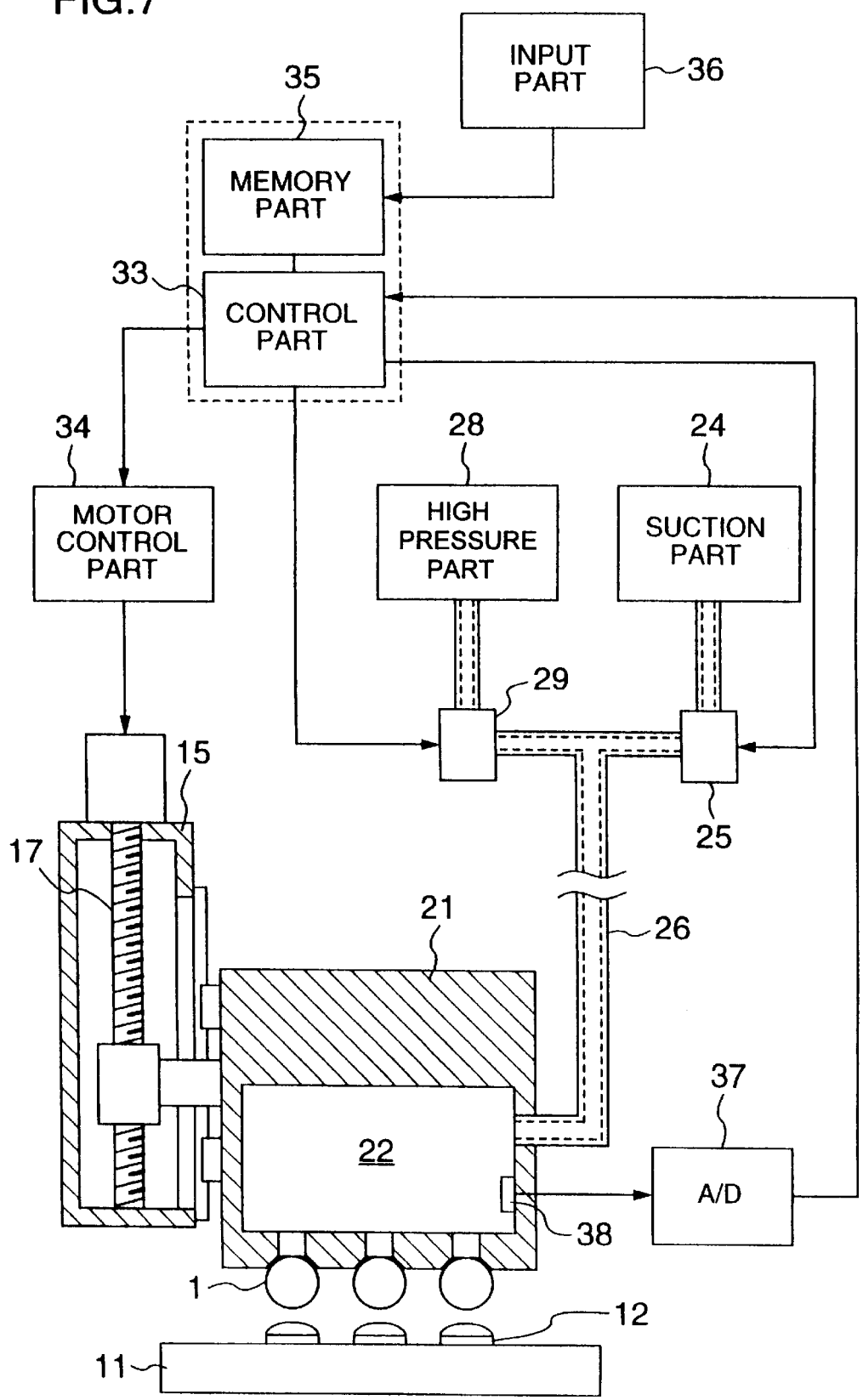
FIG. 7 is a block diagram showing a suction head in a device for mounting conductive balls in a third embodiment of the present invention.
Figure 9A:
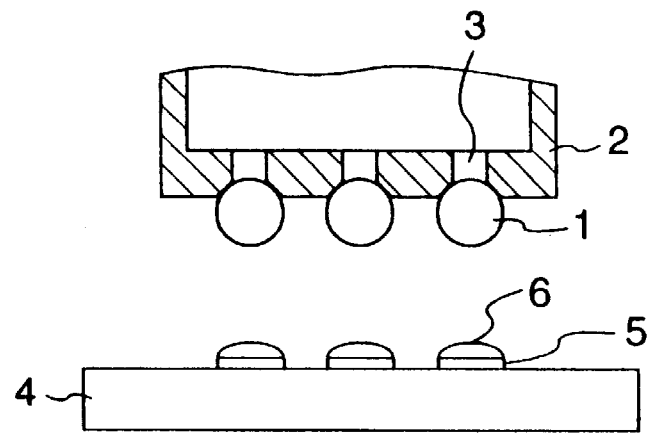
FIGS. 9a to 9c are views for explaining a conventional method of mounting conductive balls.
Figure 9B:
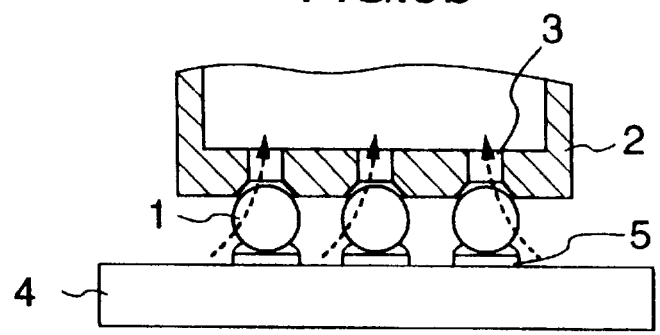
Figure 9C:
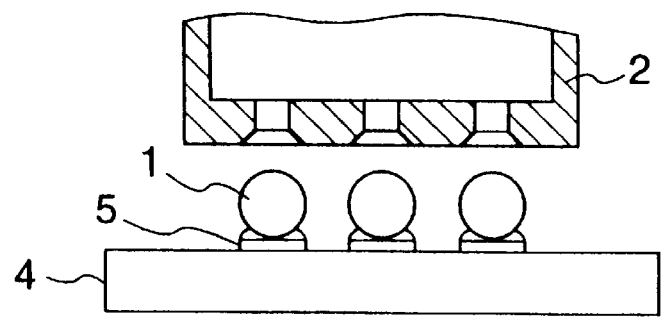

Referring to FIG. 7, the space 22 incorporates therein a pressure sensor 38 which is connected to a control part 33 through an A/D converter 37. The pressure sensor 38 detects an internal pressure of the space 22, and transmits detected data to the control part 33.

Referring to FIG. 8, explanation will be hereinbelow made of the operation of the device in the third embodiment.

The operation from the timing t1 to t7 similar to that of the device explained in the first embodiment, and explanation thereto will be omitted for the sake of brevity.

In the third embodiment, the internal pressure of the space 22 is measured by the pressure sensor 38, and accordingly, the second valve 29 is closed at the timing t7 so as to stop the feed of the positive pressure. Then, air leaks from the space 22 through slight gaps between the suction holes 23 and the conductive balls 1, and accordingly, the internal pressure of the space 22 gradually decreases. When the pressure sensor 38 detects such a condition that the internal pressure of the space 22 drops to a predetermined pressure P, it is determined that the suck-up of the conductive balls 1 has been substantially released. Accordingly, the suction head 21 is raised (at the timing t8). Thus, the conductive balls 1 are mounted on the pads 12 of the workpiece 11. It is noted that the arrangement of the third embodiment may be combined with the arrangement of the first embodiment.

In view of the foregoing, according to the present invention, when the suction head mounts the conductive balls onto the pads of the workpiece, the vacuum condition in the suction head is positively broken, and accordingly, the conductive balls sucked up to the suction holes are rapidly separated from the suction holes. Thereby it is possible to surely mount the conductive balls on the pads of the workpiece.

What is claimed is:

1. A method of mounting conductive balls onto pads of a workpiece, comprising the steps of:

applying a vacuum to a hollow suction head so as to effect a vacuum in an internal space therein;

introducing said suction head into a conductive balls supply part so as to suction the conductive balls to suction holes which are formed in a lower surface of said suction head and which are in communication with said internal space;

introducing said suction head to said workpiece so as to place said conductive balls suctioned to said suction holes into contact with said pads of said workpiece;

releasing the vacuum in said internal space while effecting a positive pressure which is higher than atmospheric pressure in said internal space and while holding said suction head in a position so as to prevent said conductive balls from being displaced from said pads by air jetted from said suction holes of said suction head in which said positive pressure is effected;

lowering the pressure of said internal space from said positive pressure to atmospheric pressure while holding said suction head in said position so as to keep said conductive balls from being displaced until atmospheric pressure is effected in said internal space; and removing said suction head from said workpiece while leaving said conductive balls on said pads of said workpiece.

2. A method as set forth in claim 1, wherein after the step of placing said conductive balls into contact with said pads of said workpiece, said conductive balls are pressed against said pads by means of said suction head.

3. A method of mounting conductive balls onto pads of a workpiece, comprising the steps of:

applying a vacuum to a hollow suction head so as to effect a vacuum in an internal space therein;

introducing said suction head into a conductive balls supply part so as to suction the conductive balls to suction holes which are formed in a lower surface of said suction head and which are in communication with said internal space;

raising said suction head from said conductive ball supply part, and introducing said suction head to a position above said workpiece;

lowering said suction head so as to place said conductive balls into contact with said pads of said workpiece;

releasing the vacuum in said internal space of the suction head while applying in said internal space a positive pressure which is higher than atmospheric pressure and while holding said suction head in a position so as to prevent said conductive balls from being displaced from said pads by air jetted from said suction holes of said suction head in which the positive pressure is effected;

rapidly lowering the pressure of said internal space from said positive pressure to atmospheric pressure by communicating said internal space with a surrounding atmosphere through a passage while holding said suction head in said position so as to keep said conductive balls from being displaced until atmospheric pressure is effected in said internal space; and raising said suction head from said workpiece while leaving said conductive balls on said pads of said workpiece.

4. A method as set forth in claim 3, wherein after the step of placing said conductive balls into contact with said pads of said workpiece, said conductive balls are pressed against said pads by means of said suction head.

5. A method of mounting conductive balls onto pads of a workpiece, comprising the steps of:

opening a first shut-off valve disposed in a suction passage between a suction part and a suction head, said suction head having an internal space formed therein and further having a surface including a plurality of suction holes which are in communication with said internal space, while closing (i) a second shut-off valve disposed in a high pressure passage between a high pressure supply part and the suction head and (ii) a third shut-off valve, disposed in a discharge passage, for placing said internal space in communication with a surrounding atmosphere, so as to effect a vacuum in the internal space;

introducing said suction head into a conductive balls supply part so as to suction the conductive balls to the suction holes;

introducing said suction head to said workpiece so as to place the conductive balls suctioned to the suction holes into contact with said pads of the workpiece;

opening said second shut-off valve while closing said first shut-off valve so as to rapidly release the vacuum in said internal space by effecting a positive pressure in said internal space which is higher than atmospheric pressure, while holding the suction head in a position so as to prevent the conductive balls from being displaced from the pads by air jetted from the suction holes of the suction head;

opening said third shut-off valve while closing said second shut-off valve so as to lower the pressure of said internal space from said positive pressure to atmospheric pressure, while holding said suction head in said position so as to keep the conductive balls from being displaced from the pads by air jetted from the suction holes until atmospheric pressure is effected in said internal space; and removing said suction head from said workpiece while leaving said conductive balls on the pads of the workpiece.

* * * * *